Figure 1:
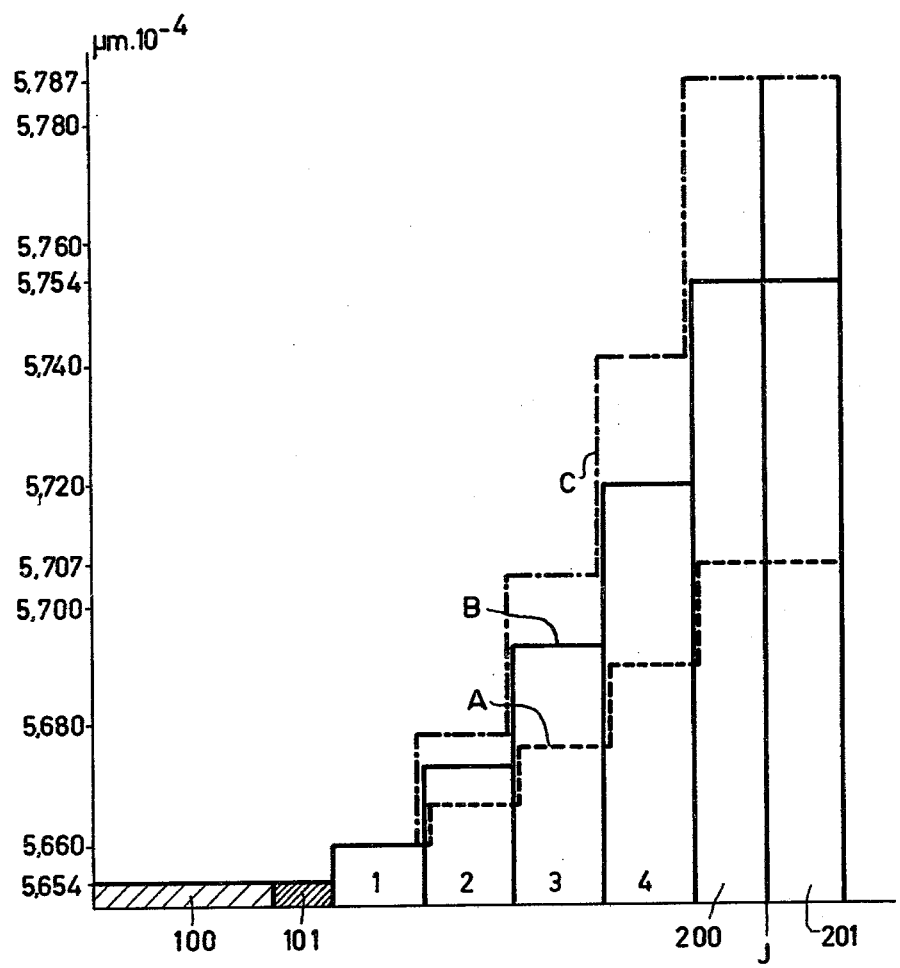

United States Patent [19]

Varon

[11] 4,274,890
[45] Jun. 23, 1981

[54] METHOD FOR THE EPITAXIAL MANUFACTURE OF A SEMICONDUCTOR DEVICE HAVING A MULTI-LAYER STRUCTURE

[75] Inventor: Jacques J. Varon, Troarn, France

[73] Assignee: U.S. Philips Corporation, New York, N.Y.

[21] Appl. No.: 72,257

[22] Filed: Sep. 4, 1979

[30] Foreign Application Priority Data

Sep. 8, 1978 [FR] France ................ 78 25861

[51] Int. Cl.³ .......................................... H01L 21/208
[52] U.S. Cl. ............................ 148/171; 148/172; 29/576 E
[58] Field of Search ............ 148/171, 172; 29/576 E; 357/30

[56] References Cited

U.S. PATENT DOCUMENTS

| | | | |
|---|---|---|---|
| 3,958,263 | 5/1976 | Panish et al. | 148/171 X |
| 3,962,716 | 6/1976 | Petroff et al. | 148/171 X |
| 3,982,261 | 9/1976 | Antypas | 148/171 X |
| 3,995,303 | 11/1976 | Nahory et al. | 357/30 |
| 4,072,544 | 2/1978 | DeWinter et al. | 148/171 |

Primary Examiner—G. Ozaki
Attorney, Agent, or Firm—Thomas A. Briody; Robert T. Mayer; Paul R. Miller

[57] ABSTRACT

A method is provided of manufacturing, on a substrate of a binary compound, layers of ternary or quaternary compounds in which epitaxial intermediate layers separate the substrate from the end layer, wherein the relative increase of the dimensions of the crystal lattices in the successive epitaxial intermediate layers increases.

10 Claims, 2 Drawing Figures

METHOD FOR THE EPITAXIAL MANUFACTURE OF A SEMICONDUCTOR DEVICE HAVING A MULTI-LAYER STRUCTURE

The present invention relates to a method for the epitaxial manufacture of a semiconductor device having a multi-layer structure which, from the base, consisting of a substrate of a semiconductor material, to the upper surface or active surface, in the proximity of which a p-n junction is present, is provided first of all with an epitaxial layer (a so-called epitaxial connection layer) having a chemical composition which is substantially identical to that of the substrate, then a plurality of successive epitaxial layers, termed epitaxial intermediate layers, the first of such intermediate epitaxial layers being nearest to the substrate, at least one semiconductor layer bearing on the epitaxial intermediate layers, the epitaxial intermediate layers and the semiconductor layer being formed chemically by elements occurring in the formula of the material of the substrate with at least one supplementary element, the proportion of the supplementary element increasing in each epitaxial intermediate layer according to whether the distance to the substrate is larger, the dimension of the crystal lattice of the material of the substrate being smaller than that of the crystal lattices of the materials of the epitaxial intermediate layers and of the semiconductor layer.

The invention relates more in particular to the epitaxial growth of quaternary and ternary intermetallic semiconductor compounds on substrates of binary III–V compounds to realize structures which can be used preferably, but not exclusively, in opto-electronics.

It is known that the greater part of the quaternary or ternary intermetallic compounds can be obtained only in the mono-crystalline form which is necessary for use in semiconductor industry by epitaxial deposition of substrates which themselves are mono-crystalline, and in which the crystal parameters of the deposits and of the substrates must be compatible. In the chemical formula of the deposit, all elements which already occur in the chemical formula of the substrate, are often found again. This is the case, for example, when GaAlAs or GaAsSb or GaInAs is grown on substrates of GaAs or when GaAsP is grown on GaP.

When the difference between the dimensions of the crystal lattices of the epitaxial reactants, for example the solid solutions of GaAs and AlAs or of GaAs and GaSb in the respective growth of GaAlAs or of GaAsSb in the liquid phase, is small (which is the case for GaAlAs), the adaptation between the two crystal lattices of the reactants present substantially no problem and the resulting epitaxial layer is of a good quality. This occurs from the first deposited epitaxial layers; the said epitaxial layer notably does show few dislocations.

When on the contrary the difference in the dimensions of the crystal lattice between the epitaxial reactants is high (which is the case for the synthesis of GaAsSb where the difference in dimension of the crystal lattice between GaAs and GaSb nearly reaches 8%), the problem occurs of the presence of numerous dislocations. This problem is particularly keen. When the dimension of the crystal lattice of the semiconductor compound is larger than that of the material of the substrate where the deposited layer thus proves to be compressed.

In difficult cases, for example, those of the growth of GaInAs or of GaAsSb or GaAs, it is known to proceed to the deposition of epitaxial intermediate layers having compositions which vary regularly (in the case of vapour phase epitaxy) or stepwise (in liquid phase epitaxy) from that of the substrate to that which corresponds to the desired chemical formula of the epitaxial compound. The dimension of the crystal lattice of the deposited material then increases either regularly or stepwise with the mutual proportion of the element of elements which are being added to those of the substrate.

Many investigations have been performed to find the best mode of stepwise growth so as to avoid formation of crystal defects as much as possible. It is felt immediately—and experience has confirmed this—that, according to whether the step between two successive chemical composition degrees is not as high, the crystal adaptation occurs better and consequently there are fewer defects. Unfortunately, such a method would lead to an increase of the number of epitaxial intermediate layers, and also would lead in the technological field to too large a complication of the material and too long operational periods.

The most generally used method consists of causing the chemical composition of the epitaxial intermediate layers to change by substantially equal steps or progressively smaller heights, each step corresponding to a constant or decreasing molecular addition of the chemical element or the chemical elements which are being added to the formula of the substrate. The heights of the steps are chosen to make the number of epitaxial intermediate layers between the substrate and the last layer technologically acceptable.

An example of the use of this method is stated in U.S. Pat. No. 3,995,303. Two cases of liquid phase epitaxy are mentioned: that of the manufacture of layers of $In_{0.18}Ga_{0.82}As$ on GaAs and that of the manufacture of layers of $GaAs_{0.907}Sb_{0.093}$ also on GaAs.

In the former case (InGaAs) the digits shown in FIG. 4A of the reference indicate that an addition which is very important in In (In=0.08) is made from the first epitaxial layer in the three epitaxial intermediate layers resulting in a layer which is richest in In, then in the two subsequent epitaxial layers, and in which extra additions are smaller and equal for the two layers ($\Delta_{In}=0.04$). Finally the extra addition is still further reduced ($\Delta_{In}=0.02$) for the leap which leads from the third epitaxial intermediate layer to the layer which is richest in In.

In the latter case (GaAsSb) the digits are recorded in FIG. 8A of the reference where also three epitaxial intermediate layers are provided between the substrate and the layer having the highest Sb-concentration. The concentration of Sb in the first of the layers is already large (Sb=0.025) and becomes comparatively less high than the new concentration ($\Delta_{Sb}=0.033$) in the second epitaxial intermediate layer. The steps which lead to the layer, either from the second epitaxial layer or third epitaxial layer ($\Delta_{Sb}=0.035$), then from the third epitaxial layer to the layer ($\Delta_{Sb}=0.037$) are substantially identical. So in the latter case there are three steps in which $\Delta_{Sb}$ is substantially the same.

According to observations made by Applicants during numerous experiments which they have carried out on the subject, the two growth profiles, either of In, or of Sb, for the above-mentioned practical examples result in layers of InGaAs or of GaAsSb, the quality of which is insufficient for the manufacture of high-performance opto-electronic devices, electroluminescent diodes or laser devices. In fact, the layers have considerable crystal defects. The reference of $10^5$ dislocations per cm$^2$, which forms a reliable barrier for evaluating the quality of a crystal layer, has been significantly surpassed in the stated cases; this is also related to the insufficient thickness chosen for the epitaxial intermediate layer (2 μm).

It is the object of the present invention to mitigate the disadvantages experienced so far in obtaining, by epitaxy, monocrystalline layers of ternary and quaternary compounds having crystal lattices with dimensions exceeding those of the materials of the underlying substrates showing few dislocations.

The present invention satisfies the necessity of establishing a growth program which, with a minimum of preceding experiments, no doubt results in particular in satisfying results from a point of view of crystal quality. This minimizes the number of inevitable epitaxial intermediate layers between the substrate and the formed layer.

According to the present invention, a method for epitaxial manufacture of a semiconductor device having a multi-layer structure which, from a base consisting of a substrate of a semiconductor material, to the upper surface or active surface having a p-n junction in proximity is provided first of all with an epitaxial layer (a so-called epitaxial connection layer) having a chemical composition which is substantially identical to that of the substrate, then a plurality of successive epitaxial layers (termed epitaxial intermediate layers). The first of the intermediate epitaxial layers is that one which is nearest to the substrate. At least one semiconductor layer bears, on the epitaxial intermediate layer and the epitaxial intermediate layers and the semiconductor layer are formed chemically by elements occurring in the formula of the material of the substrate with at least one supplementary element. The proportion of the supplementary element in each epitaxial intermediate layer increases according to whether the distance to the substrate increases or is larger, and the dimension of the crystal lattice of the material of the substrate is smaller than that of the crystal lattices of the materials of the epitaxial intermediate layers and of the semiconductor layer. This structure is characterized in that the relative increase of the dimension of the crystal lattice of the material of the first epitaxial intermediate layer relative to that of the crystal lattice of the material of the substrate is chosen to be lower than $1.2 \times 10^{-3}$ and that the relative increase of the dimension $a_n$ of the crystal lattice of the material of an epitaxial intermediate layer having number n with respect to the dimension $(a_{n-1})$ of the crystal lattice of the material of the epitaxial intermediate layer having number n−1 which precedes the layer having number n is chosen to be equal to the product $α·n$, where $α$ is a coefficient between $6 \times 10^{-4}$ and $1.6 \times 10^{-3}$.

The method as defined by the present invention, corresponds to the manufacture of a first epitaxial intermediate layer in which a small part originates from the supplementary element which is added to those which are already present in the chemical formula of the substrate so that the composition of the first epitaxial layer differs very little from that of the substrate and the difference in lattices of the two materials is rapidly bridged. The growth program according to the present invention then comprises a stepwise, ever stronger introduction of the element in the successive epitaxial intermediate layers, in which the differences in height of the successive steps may be very large, when $α$ is chosen to be near the upper limit: $1.6 \times 10^{-3}$; this causes a considerable difference in the crystal parameters near the interfaces of the epitaxial intermediate layers, which in contrast with what could be feared, does not very adversely influence the good crystal formation of the epitaxial layer or the forming layer.

Experience has demonstrated that this method of "steps with rapidly increasing height" would lead to obtaining layers of excellent quality which is incomparably better than that of the layers obtained by the above-mentioned methods used so far. The method enables in particular to achieve very satisfactory results in difficult cases such as that of the growth of $In_yGa_{1-y}As$ and of $GaAs_{1-x}Sb_x$ on GaAs; this is even true for layers having a high content either of In, or of Sb, as the case may be.

The value or the values of the coefficient $α$ to be used can be chosen experimentally for each individual case. At any rate the method results without many experiments in good qualitative results while using a minimum number of epitaxial intermediate layers.

According to a characteristic feature of the structures manufactured by means of the method according to the present invention the epitaxial intermediate layers have a thickness of at least three micrometers. This thickness has been recognised as desirable by Applicants to reduce the density of crystal defects.

On the other hand, the use of the method according to the present invention, a few details excepted, is analogous to that which is followed in a usual epitaxial treatment, this as regards both the material used and the process applied.

In the layers of $GaAs_{1-x}Sb_x$, for example, liquid phase epitaxy is carried out in a crucible having several compartments. The liquid solution in each compartment has a different composition, which is richer and richer in Sb, and the temperature regularly decreases at each stage. Doping elements are introduced in the liquid solutions so as to give each layer a desired conductivity type.

The method according to the present invention permits in particular the manufacture of electroluminescent diodes according to a double hetero-junction structure which is known per se but which, due to the excellent quality of the material used, shows improved properties with respect to analogous known diodes. In particular, a better electroluminescent efficiency is obtained, with the composition of the surface layers being identical.

Complementary indications which relate to the construction of such diodes will be given hereinafter.

The field of application of the invention is not restricted to electroluminescent diodes only; it also relates in particular to the manufacture of laser devices and photo-diodes.

The invention will now be described in greater detail with reference to the accompanying drawings.

The graph of FIG. 1 shows the profile of the variation of the dimension of the crystal lattice of a ternary compound formed starting from a substrate of a binary compound, according to the method of the "steps with rapidly increasing height" according to the present invention, namely of a compound of $GaAs_{1-x}Sb_x$, which is formed by liquid epitaxy on a substrate of GaAs.

Figure 2:
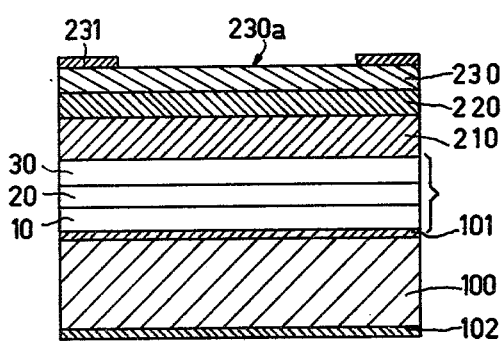

FIG. 2 shows as an example of this growth process according to the present invention an electroluminescent diode having a double heterojunction in a vertical cross-section.

The numerals in the graph of FIG. 1 on the vertical axis denote dimensions of crystal lattices in $\mu m.10^{-4}$. The smallest dimension —5.654— corresponds to the lattice of GaAs. The other numerals correspond to dimensions of the lattices of $GaAs_{1-x}Sb_x$ for variable values of the parameter x. On the horizontal axis are shown, without observing thickness values, the successive regions which form a multilayer semiconductor structure starting from the substrate 100, in the present case of GaAs, to two surface layers 200 and 201, of $GaAs_{1-x}Sb_x$, which, for example, mutually determine a homo-junction J. The regions 200 and 201 are separated from the substrate 100 by an epitaxial connection layer 101 of GaAs, then by four epitaxial intermediate layers which are referenced 1,2,3 and 4, of $GaAs_{1-x}Sb_x$, where the term x increases stepwise from one epitaxial layer to the next according to a process which is defined by the present invention.

In the graph of FIG. 1, three curves A, B and C are drawn, which correspond to values of the coefficient $\alpha$ of $6 \times 10^{-4}$, $1.2 \times 10^{-3}$, and $1.6 \times 10^{-3}$, so that curves A and C provide the two extreme values of $\alpha$ according to the invention and, curve B provides an intermediate value of $\alpha$. In order to distinguish the three curves, curve A is shown in broken lines, curve B in a solid line and curve C as a dot-and-dash line.

Curves A, B and C are the graphic translation of the invention which, for the first epitaxial intermediate layer 1, gives a dimension of the crystal lattice: $a_1 = a_0 (1 + 1.2 \times 10^{-3} \text{ max})$ with $a_0 = 5.654$ $\mu m.10^{-4}$ (lattice of GaAs) and, for the other intermediate layers, lattice dimensions are given by the formula $a_n = a_{n-1}(1 + \alpha.n)$.

The curves correspond to table I hereinafter, drawn up starting from the two above-stated formulae in the presence, by way of example, of four epitaxial intermediate layers. The value of the relative increase of the dimensions of the lattices between the first epitaxial intermediate layer and the substrate for this example has been chosen to be $1.1 \times 10^{-3}$.

epitaxial layer 3 and for values of $\alpha$ of $1.2 \times 10^{-3}$ and of $1.6 \times 10^{-3}$ become large.

For each curve A, B and C the same coefficient $\alpha$ is used to characterize the step in the composition which separates the epitaxial layer 4 from the layer 200. Dependent on the composition which it is desired to give to the layer 200, and for greater accuracy, it should be understood that for this latter step a value $\alpha$ could be used which differs slightly from that chosen initially. Also, in the steps from epitaxial intermediate layer to epitaxial intermediate layer it is not necessary to strictly maintain $\alpha$ at the same number. Experience aids in making these details precise on the understanding, and this is primary, that a stepwise increase of significant value should be maintained between the successive deposits.

In the electroluminescent diode having a double heterojunction of $Ga_{1-y}Al_yAs_{1-x}Sb_x/GaAs_{1-x}Sb_x$ chosen by way of example, which uses the method according to the present invention and which is shown in FIG. 2, the following regions are distinguished from the base, which consists of a substrate 100, to the upper surface or active face 230a in the proximity of which the active layers of the device are present:

the substrate 100 of GaAs oriented crystallographically with the main faces according to the <100> plane, of conductivity type N, doped in a concentration of $2 \times 10^{17}$ to $10^{18}$ atoms per $cm^3$ with silicon having an initial thickness of 500 $\mu m$ which is reduced to 150 $\mu m$ in the finished device;

an epitaxial layer 101 or epitaxial connection layer of GaAs of N-conductivity type and a thickness of 2 $\mu m$;

three successive epitaxial layers 10,20,30, so-called epitaxial intermediate layers, of $GaAs_{1-x}Sb_x$, of N-conductivity type, all three doped with tin, as well as the epitaxial connection layer 101, in which the general doping concentration is $5 \times 10^{16}$ to $5 \times 10^{17}$ atoms per $cm^3$. The dimensions of the crystal lattices of the materials of each of the epitaxial layers 10, 20 and 30 are 5.660, 5.671, and 5.688, respectively, which corresponds

TABLE I

| | | Dimension of the crystal lattice in $\mu m\ 10^{-4}$ | | | | | |
|---|---|---|---|---|---|---|---|
| | $\alpha$ | substrate 100 epi-layer101 | epi-layer 1 | epi-layer2 | epi-layer3 | epi-layer4 | layers 200 201 |
| Curve A | $6 \times 10^{-4}$ | 5.654 | 5.660 | 5.667 | 5.676 | 5.690 | 5.707 |
| Curve B | $1.2 \times 10^{-3}$ | 5.654 | 5.660 | 5.673 | 5.693 | 5.720 | 5.754 |
| Curve C | $1.6 \times 10^{-3}$ | 5.654 | 5.660 | 5.678 | 5.705 | 5.741 | 5.787 |

Table II hereinafter plotted in the same manner as table I, indicates the rounded-off values of the parameter x in the formula $GaAs_{1-x}Sb_x$ for each of the lattice dimensions.

substantially to the values of 0.013, 0.038, and 0.077 of the parameter x. These epitaxial layers have a thickness of 4 $\mu m$ each;

a layer 210 of $Ga_{0.8}Al_{0.2}As_{0.88}Sb_{0.12}$ of N-conduc-

TABLE II

| | | | Value of x | | | | |
|---|---|---|---|---|---|---|---|
| | $\alpha$ | Substrate 100 epi-layer101 | epi-layer1 | epi-layer2 | epi-layer3 | epi-layer4 | layers 200 201 |
| Curve A | $6 \times 10^{-4}$ | — | 0.013 | 0.028 | 0.050 | 0.081 | 0.120 |
| Curve B | $1.2 \times 10^{-3}$ | — | 0.013 | 0.044 | 0.089 | 0.150 | 0.227 |
| Curve C | $1.6 \times 10^{-3}$ | — | 0.013 | 0.054 | 0.116 | 0.198 | 0.301 |

It is obvious from curves A, B, C that the evolution of the composition of the ternary compound, epitaxial layer by epitaxial layer, is readily carried out as provided by the invention according to steps having rapidly increasing height. Notably the differences from tivity type doped with tin in a concentration of $5 \times 10^{16}$ to $5 \times 10^{17}$ atoms per $cm^3$ in a thickness of 3 to 10 $\mu m$. This layer 210 is the so-called injection layer;

a layer 220 of $GaAs_{0.88}Sb_{0.12}$ of P-conductivity type, doped with germanium in a concentration of $2 \times 10^{18}$ atoms per cm$^3$ in a thickness of 0.5 to 4 μm. This layer 220 is the so-called active layer in which radiative recombinations occur;

finally a layer 230 of $Ga_{0.8}Al_{0.2}As_{0.88}Sb_{0.12}$ of P-conductivity type doped with germanium in a concentration of $5\times10^{17}$ to $5\times10^{18}$ atoms per cm$^3$ in a thickness of 1 to 6 μm. This layer 230 is the so-called closing layer which forms a barrier for the electrons directed to the surface 230a.

Contact pads are provided on the one hand on the rear side of the substrate 100 (metallization 102 of tin), and on the other hand on local faces of the active surface 230a (metallization 231 of gold $_{0.99}$-beryllium$_{0.01}$).

The three layers 210, 220 and 230 have substantially the same crystal lattice dimensions, for example 5.707 μm·10$^{-4}$, in spite of the presence of aluminium in only two of them. It is known that the substitution of aluminium atoms by gallium atoms has little influence on the crystal parameters.

The device described which is known per se in its general arrangement, is characterized in that it comprises three epitaxial intermediate layers of $GaAs_{1-x}Sb_x$, of which the mutual compositions are obtained by means of the method according to the invention. The rapid stepwise increase is to be noted which for these three epitaxial layers leads to a content of 12% antimony of the layers 210,220 and 230. This content of 12% of Sb is desired to obtain a light emission with $\lambda\simeq1.06$ μm, which corresponds to electroluminescent elements for the optical telecommunication of which an optical fiber and an electroluminescent device form an integrating part.

The structure shown in FIG. 2 is treated by liquid epitaxy in a crucible having several compartments.

The epitaxy is initiated at a temperature of 780° C. for the epitaxial layer 101. For the three epitaxial intermediate layers 10,20,30 of $GaAs_{1-x}Sb_x$ the deposits are carried out at temperatures of 772° C., 768° C., 764° C., respectively, in the conventional manner from liquid solutions of GaAs and of GaSb, the content of Sb increasing in the prescribed manner from one compartment to the other, which means for the first epitaxial layer 10 the provision of 1.3% Sb in the solution, for the second and third epitaxial layers 20 and 30, complementary additions of 2.5% and 3.9%, respectively, the two latter digits correlating with a coefficient $\alpha$ for the mutual increase of the crystal lattice of $1.0\times10^{-3}$. As regards the layer 210, this is deposited at a temperature of 760° C. from a liquid solution consisting of gallium, antimony, aluminium and gallium arsenide with a complementary addition of 4.3% Sb with respect to the liquid solution which enables the epitaxial layer 30 to be obtained, which corresponds to a coefficient $\alpha$ having a value of $8.5\times10^{-4}$. For the layers 220 and 230 finally the respective deposition temperatures are 756° C. and 754° C.

A diode as just described has interesting characteristic features for operation at a wavelength of $\simeq1.06$ μm at which it emits, this in connection with the extraordinary quality of the epitaxial intermediate layers 10, 20 and 30 which have contributed to its formation.

The luminous power emitted per injected current unit is approximately 3 mW/A. On the other hand the radiance lies near 1 W·cm$^{-2}$·sr$^{-1}$ with an injected current density of 1000 A·cm$^{-2}$.

These figures are near those obtained with GaAs diodes manufactured in the conventional manner. It should be noted, however, that the emission wavelength of 1.06 μm is considerably higher than that of diodes of GaAs and corresponds to the best coupling conditions with optical fibers. With diodes of GaAs the losses by absorption and dispersion in the optical fibers are higher than with the diodes taken above as an example.

The example described above for the manufacture of a diode starting from GaAsSb material on GaAs is not restrictive for the present invention. It also extends to the manufacture of semiconductor devices, optoelectronic devices or other devices with material combinations, for example, in particular GaAsP/GaP, GaInAs/GaAs, InAsSb/InAs, for which the same gradiation for the growth may be adopted.

Although the present invention is designed more in particular for processing ternary or quaternary compounds of the group III-V, it also extends to other compounds, especially of the group II-VI.

What is claimed is:

1. A method for epitaxial manufacture of semiconductor devices having a multilayer structure consisting of a base semiconductor substrate extending to an upper active surface with a p-n junction in proximity thereto comprising the steps of forming an epitaxial connection layer on said substrate having a chemical composition substantially identical to said substrate, forming a plurality of successive epitaxial intermediate layers on said connection layer, said intermediate layers being chemically formed by elements of said substrate with at least one additional complementary element, said complementary element in each intermediate layer substantially increasing in amount in each intermediate layer in proportion to distance from said substrate, said substrate having crystal lattice dimensions smaller than those of said intermediate layers, and forming at least one semiconductor layer on said intermediate layers, said semiconductor layer being chemically formed by elements of said substrate with at least one additional complementary element, said substrate having crystal lattice dimensions smaller than those of said semiconductor layer, wherein the relative increase of said crystal lattice dimensions of a first intermediate layer in closest proximity to said substrate is chosen to be less than $1.2\times10^{-3}$ relative to the crystal lattice dimensions of said substrate, and wherein the relative increase of the crystal lattice dimensions $a_n$ of the n$^{th}$ intermediate layer to the crystal lattice dimensions $a_{n-1}$ of the $n-1$ intermediate layer is chosen to be equal to $\alpha n$ where $\alpha$ is a coefficient between $6\times10^{-4}$ and $1.6\times10^{-3}$.

2. A method as claimed in claim 1, wherein said coefficient $\alpha$ is different for processing at least two intermediate layers from that for the second intermediate layer.

3. A method as claimed in claim 1, wherein said semiconductor layer has a composition differing in said complementary element from that of said intermediate layer on which it bears.

4. A method as claimed in claim 1, wherein said semiconductor layer has a relative increase of lattice dimension with respect to that of said intermediate layer on which it bears by the product of $\alpha(n+1)$, where n is the number of said intermediate layer.

5. A method as claimed in claim 1, wherein said intermediate layers are formed with a minimum thickness of three micrometers.

6. A method as claimed in claim 1, wherein said intermediate layers and said at least one semiconductor layer are formed by liquid phase epitaxy.

7. A method as claimed in claim 1, wherein at least three of said intermediate layers and at least two of said semiconductor layers are formed.

8. A method as claimed in claim 7, wherein said p-n junction is formed between said two semiconductor layers.

9. A method as claimed in claim 1, wherein said substrate is formed of one of GaAs, GaP or InAs, and wherein at least one of said intermediate layers include one of GaAlAs, GaInAs and GaAsSb if said substrate is formed of GaAs, include GaAsP if said substrate is formed of GaP, and include InAsSb if said substrate is formed of InAs.

10. A method as claimed in claim 1, wherein said additional complementary element in said at least one semiconductor layer increases substantially in amount over that in said intermediate layers.

* * * * *